United States Patent
Naito et al.

(10) Patent No.: US 9,496,480 B2
(45) Date of Patent: Nov. 15, 2016

(54) RESONATOR ELEMENT, RESONATOR, ELECTRONIC DEVICE AND ELECTRONIC APPARATUS

(71) Applicant: Seiko Epson Corporation, Tokyo (JP)

(72) Inventors: Matsutaro Naito, Kamiina-gun (JP); Hideo Endo, Kamiina (JP); Toshihiro II, Kamiina-gun (JP)

(73) Assignee: Seiko Epson Corporation (JP)

( * ) Notice: Subject to any disclaimer, the term of this patent is extended or adjusted under 35 U.S.C. 154(b) by 369 days.

(21) Appl. No.: 13/845,236

(22) Filed: Mar. 18, 2013

(65) Prior Publication Data

US 2013/0249353 A1 Sep. 26, 2013

(30) Foreign Application Priority Data

Mar. 21, 2012 (JP) ................................ 2012-063267

(51) Int. Cl.
*H03H 9/05* (2006.01)
*H01L 41/08* (2006.01)
*H03H 9/02* (2006.01)
*H03H 9/17* (2006.01)
(Continued)

(52) U.S. Cl.
CPC ...... *H01L 41/0825* (2013.01); *H03H 9/02023* (2013.01); *H03H 9/02157* (2013.01); *H03H 9/177* (2013.01); *H03H 9/19* (2013.01); *H03H 9/0519* (2013.01); *H03H 9/0542* (2013.01); *H03H 9/0552* (2013.01); *H03H 9/1021* (2013.01)

(58) Field of Classification Search
CPC ........ H03H 9/05; H03H 9/0504; H03H 9/10; H03H 9/1007; H03H 9/1021; H03H 9/15; H03H 9/17; H03H 9/19; H03H 9/21
USPC ......................................... 310/320, 348, 368
See application file for complete search history.

(56) References Cited

U.S. PATENT DOCUMENTS 6,191,524 B1 2/2001 Sasaki et al.
7,411,649 B2 8/2008 Umetsu
7,518,294 B2 4/2009 Umetsu
(Continued)

FOREIGN PATENT DOCUMENTS

JP 2-10669 3/1990
JP 10-107580 4/1998
(Continued)

OTHER PUBLICATIONS

Goka et al., "Decoupling Effect of Multi-stepped Bi-mesa AT-cut Quartz Resonators", 2003.*

*Primary Examiner* — Derek Rosenau
(74) *Attorney, Agent, or Firm* — Harness, Dickey & Pierce, P.L.C.

(57) ABSTRACT

When a size from a main surface of an outer edge to a step of a first stage of a vibration section is Md1, a size from the step of the first stage to a step of a second stage is Md2, a density of materials of the substrate is $d_A$, a density of materials of the excitation electrode is $d_B$, and a thickness of the excitation electrode on a main surface of a mesa of the second stage is $t_B$, a relationship of $((Md2+(d_B/d_A) \times t_B))/Md1 \leq 1.4$ is satisfied.

14 Claims, 8 Drawing Sheets

(51) Int. Cl.
*H03H 9/19* (2006.01)
*H03H 9/10* (2006.01)

(56) References Cited

U.S. PATENT DOCUMENTS

| | | | |
|---|---|---|---|
| 2007/0096596 A1 | 5/2007 | Naito et al. | |
| 2010/0066213 A1* | 3/2010 | Takahashi | H03H 3/02 310/364 |
| 2010/0207696 A1* | 8/2010 | Sayama | 310/348 |
| 2011/0203083 A1* | 8/2011 | Sasaki | H03H 3/02 29/25.35 |
| 2012/0126668 A1 | 5/2012 | Il et al. | |
| 2012/0229223 A1 | 9/2012 | Il et al. | |
| 2012/0235762 A1 | 9/2012 | Il et al. | |

FOREIGN PATENT DOCUMENTS

| | | |
|---|---|---|
| JP | 11-355094 | 12/1999 |
| JP | 2003-046366 | 2/2003 |
| JP | 2006-014270 | 1/2006 |
| JP | 2006-166275 | 6/2006 |
| JP | 2007-053820 | 3/2007 |
| JP | 2007-124441 | 5/2007 |
| JP | 2008-263387 | 10/2008 |
| JP | 2010-028610 | 2/2010 |
| JP | 2010-109527 | 5/2010 |
| JP | 2012-114495 | 6/2012 |
| JP | 2012-114496 | 6/2012 |
| JP | 2012-191299 | 10/2012 |
| JP | 2012-191300 | 10/2012 |
| JP | 2012-199602 | 10/2012 |

* cited by examiner

RESONATOR ELEMENT, RESONATOR, ELECTRONIC DEVICE AND ELECTRONIC APPARATUS

BACKGROUND

1. Technical Field

The present invention relates to a resonator element, a resonator, an electronic device and an electronic apparatus.

2. Related Art

In recent years, as a piezoelectric vibration device tends to be small, it is desirable that a CI (crystal impedance) value be decreased. It is known to adopt a mesa structure in order to decrease the CI value and confine vibration energy.

JP-A-2007-124441 discloses a piezoelectric resonator element that defines an optimum value of an etching amount from a substrate for obtaining a mesa structure. More specifically, in JP-A-2007-124441, when the etching amount is Md, a length of a long side of a quartz crystal substrate is x, and a thickness of a vibration section is t, if a percentage y of a ratio to the thickness t of an etching amount Md of a step portion with reference to the thickness t is set, a relationship of $y=-1.32 \times (x/t)+42.87$ is satisfied. Therefore, it is disclosed that a minimum etching amount Md can be selected to allow a characteristic change in the CI value to be flat.

Further, JP-A-2008-263387 discloses that not only an optimum value of the etching amount from value of the substrate, but also a range of the length of the long side in an application range of conductive adhesive applied when the piezoelectric resonator element is mounted on amount substrate are defined to suppress a binding of an unnecessary mode, and to promote a decrease in the IC value.

Further, JP-A-2010-28610 discloses that by defining the length from the end of the vibration section to the end of the excitation electrode, the characteristic deterioration such as the increase in the CI value can be suppressed.

Therefore, the decrease in the CI value has been contemplated from various viewpoints.

SUMMARY

An advantage of some aspects of the invention is to provide a resonator element capable of decreasing a CI value. Another advantage of some aspects of the invention is to provide a resonator having the resonator element. Still another advantage of some aspects of the invention is to provide an electronic device having the resonator element. Yet another advantage of some aspects of the invention is to provide an electronic apparatus having the resonator element.

The invention can be implemented as the following aspects or application examples.

Application Example 1

This application example is directed to a resonator element including a substrate having a vibration section that vibrates in a thickness shear vibration mode and has a step on a side surface, and an outer edge that is disposed along an outer edge of the vibration section and has a thickness thinner than that of the vibration section; and an excitation electrode that is disposed on the vibration section, wherein when a size from a main surface of the outer edge to a step of a first stage of the vibration section is Md1, a size from the step of the first stage to a step of a second stage is Md2, a density of materials of the substrate is $d_A$, a density of materials of the excitation electrode is $d_B$, and a thickness of the excitation electrode on a main surface of a mesa of the second stage is $t_B$, a relationship of $((Md2+(d_B/d_A) \times t_B))/Md1 \leq 1.4$ is satisfied.

According to the resonator element of this application example, the resonator element is capable of decreasing the CI value (to be described in detail later).

Application Example 2

In the resonator element according to the application example, a relationship of $0.5 \leq ((Md2+(d_B/d_A) \times t_B))/Md1 \leq 1.4$ is satisfied.

In the resonator element according to this application example, the resonator element is more reliably capable of decreasing the CI value (to be described in detail later).

Application Example 3

In the resonator element according to the application example, the substrate is a rotated Y-cut quartz crystal substrate.

According to the resonator element of this application example, the resonator element is capable of decreasing the CI value.

Application Example 4

In the resonator element according to the application example, an outer shape of the vibration section is a rectangular shape in plan view, and a length along a vibrating direction of the thickness shear vibration of the first stage of the vibration section is longer than the length along a vibrating direction of the thickness shear vibration of the second stage of the vibration section.

According to the resonator element of this application example, the resonator element is capable of decreasing the CI value.

Application Example 5

In the resonator element according to the application example, an outer shape of the excitation electrode is the same as the outer shape of the second stage of the vibration section in plan view.

In the resonator element according to this application example, the resonator element is capable of decreasing the CI value.

Application Example 6

This application example is directed to a resonator including the resonator element according to the application example, and a package accommodating the resonator element.

According to this application example, the resonator may have the resonator element which is capable of decreasing the CI value.

Application Example 7

This application example is directed to an electronic device including the resonator element according to the application example, and an electronic element.

According to this application example, the resonator may have the resonator element which is capable of decreasing the CI value.

Application Example 8

This application example is directed to an electronic apparatus including the resonator element according to the application example.

According to this application example, the electronic apparatus may have the resonator element which is capable of decreasing the CI value.

BRIEF DESCRIPTION OF THE DRAWINGS

The invention will be described with reference to the accompanying drawings, wherein like numbers reference like elements.

DESCRIPTION OF EXEMPLARY EMBODIMENTS

Preferred embodiments will be described in detail with reference to the drawings. In addition, the embodiments described below do not unreasonably limit the content of the invention disclosed in the appended claims. In addition, not all configurations described below are limited to essential configuring elements of the invention.

1. Resonator Element

Figure 1:
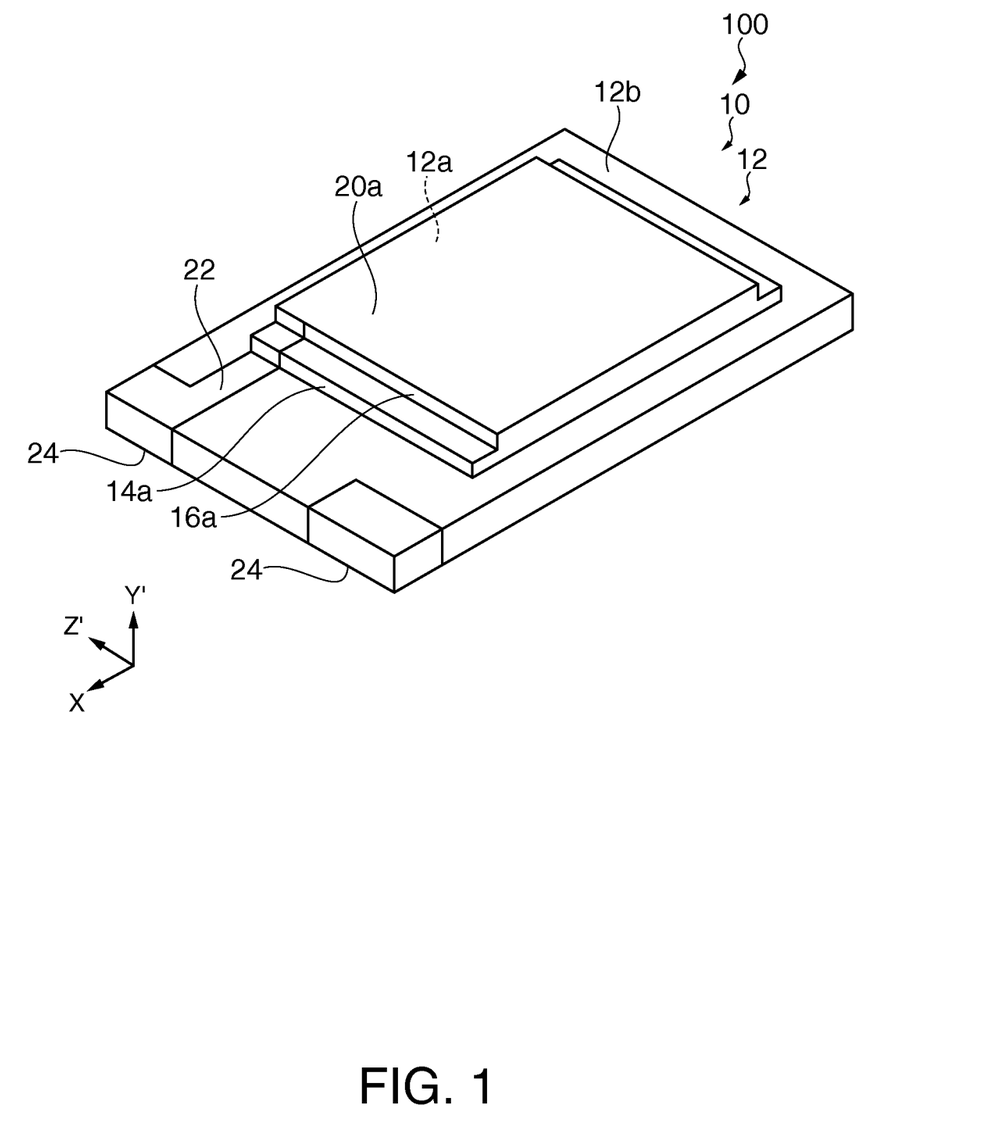
FIG. 1 is a perspective view schematically illustrating a resonator element according to the embodiment.
Figure 2:
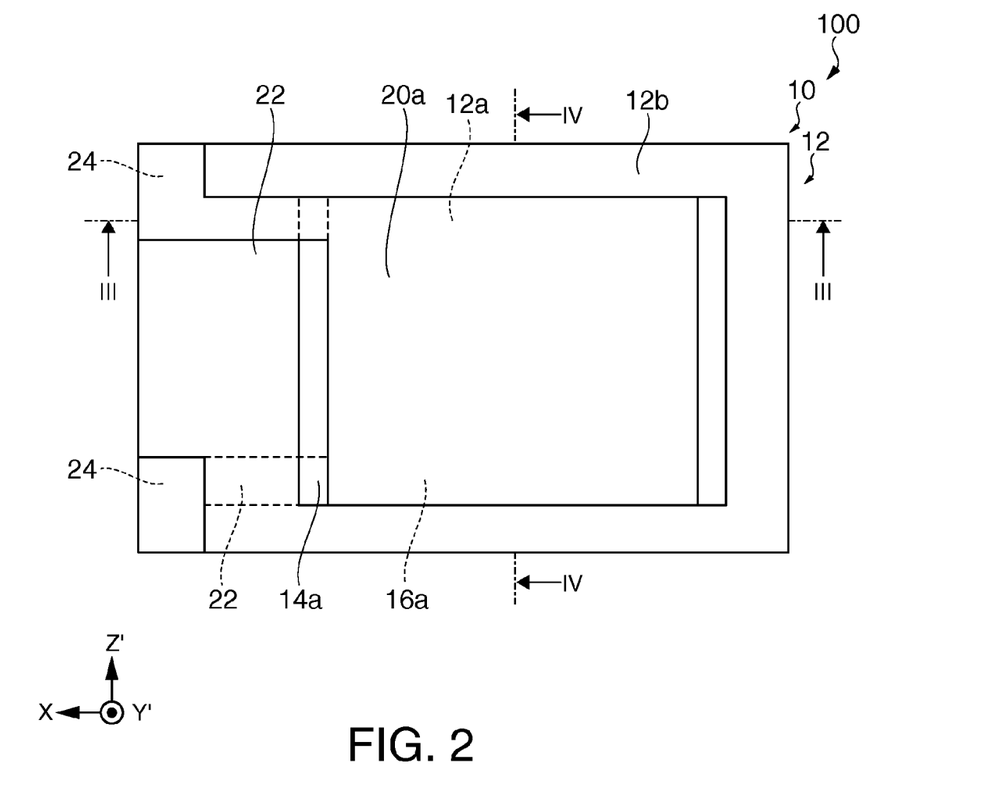
FIG. 2 is a plan view schematically illustrating a resonator element according to the embodiment.
Figure 3:
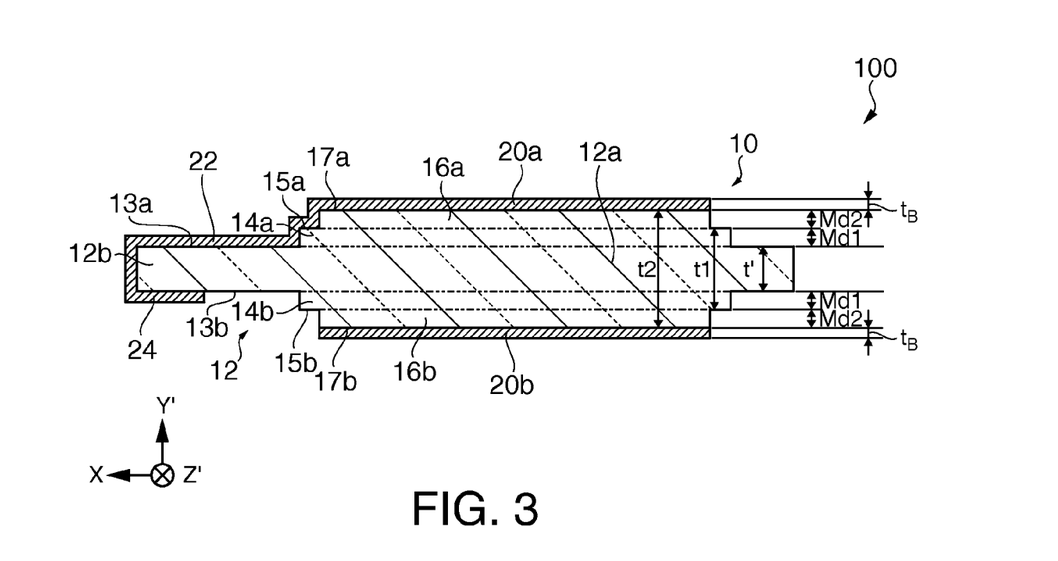
FIG. 3 is a cross-sectional view schematically illustrating a resonator element according to the embodiment.
Figure 4:
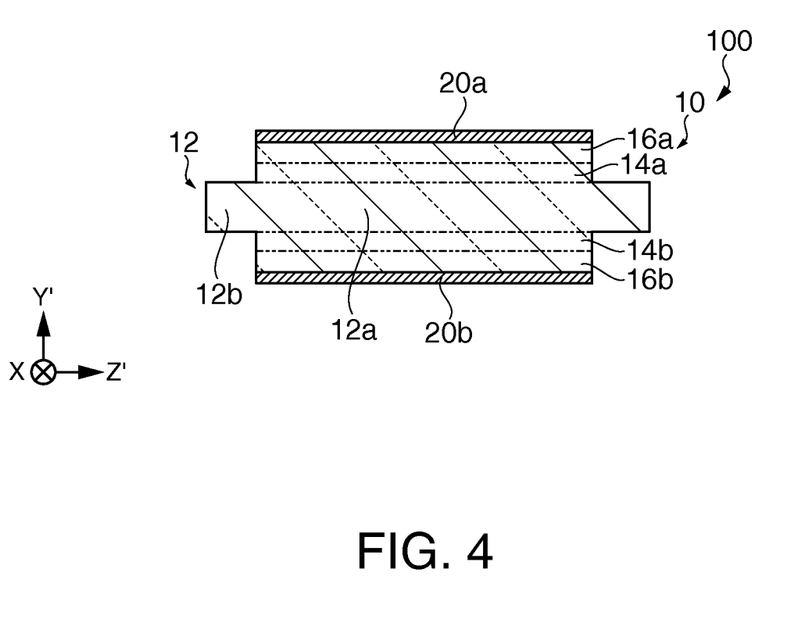
FIG. 4 is a cross-sectional view schematically illustrating a resonator element according to the embodiment.

First, a resonator element will be described with reference to the drawings. FIG. 1 is a perspective view schematically illustrating a resonator element 100 according to the embodiment. FIG. 2 is a plan view schematically illustrating the resonator element 100 according to the embodiment. FIG. 3 is a cross-sectional view taken along the line III-III in FIG. 2 schematically illustrating a resonator element 100 according to the embodiment. FIG. 4 is a cross-sectional view taken along line IV-IV in FIG. 2, schematically illustrating the resonator element 100 according to the embodiment.

As illustrated in FIGS. 1 to 4, the resonator element 100 include a resonator element 10, an excitation electrodes 20a and 20b, a connection electrode 22 and a mount electrode 24.

The resonator element 10 is configured to include a piezoelectric substrate (substrate) 12 of a mesa structure having a vibration section 12a and the outer edge 12b. For example, the materials of the piezoelectric substrate 12 employ piezoelectric materials. For example, the piezoelectric substrate 12 employs a rotated Y-cut substrate such as an AT-cut quartz crystal substrate.

Figure 5:
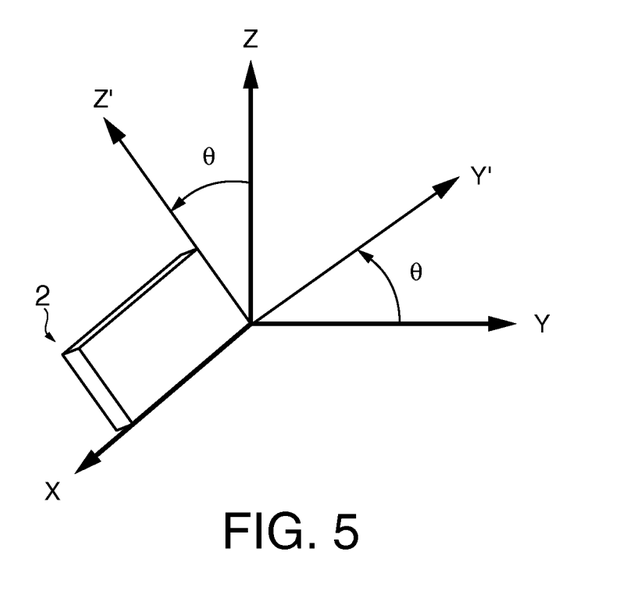
FIG. 5 is a perspective view schematically illustrating an AT-cut quartz substrate.

Herein, FIG. 5 is a perspective view schematically illustrating the AT-cut quartz crystal substrate 2. A piezoelectric material such as quartz crystal is generally a trigonal system, and has crystal axes (X, Y, Z) illustrated in FIG. 5. The X axis is an electrical axis, the Y axis is a mechanical axis, and the Z axis is an optical axis. The rotated Y-cut substrate is a flat plate that is cut out from the piezoelectric material (for example, synthetic quartz crystal) along a plane on which an XZ plane is rotated around the X axis by an angle θ. Herein, for example, the AT-cut quartz crystal substrate 2 has the angle θ=35° 15'. When the Y axis and the Z axis are rotated around the X axis by the angle θ, the Y axis and the Z axis are set to be a Y' axis and a Z' axis respectively. Therefore, the rotated-Y cut substrate has the crystal axes (X, Y', Z'). In the AT-cut quartz crystal substrate 2 having θ=35° 15', a plane XZ' (a plane including the X axis and Z' axis) orthogonal to the Y' axis becomes a main surface (an excitation surface), and can vibrate in a thickness shear vibration mode as a main vibration. The AT cut-quartz crystal substrate 2 may be processed to obtain the piezoelectric substrate 12.

That is, the piezoelectric substrate 12 is made of the AT-cut quartz crystal substrate which is configured on a surface parallel to the X axis and the Z' axis and has a thickness in a direction parallel to the Y' axis, when the X axis as the electrical axis, the Y axis as the mechanical axis, and the z axis as the optical axis, all of which are the crystal axes of the quartz crystal as illustrated in FIG. 5, for example, form an orthogonal coordinate system, and about the center of the X-axis of the orthogonal coordinate system, an axis inclining the Z axis in a −Y axial direction of the Y axis is set to the Z' axis and an axis inclining the Y axis in a +Z direction of the Z axis is set to the Y' axis.

In addition, the piezoelectric substrate 12 is not limited to the AT-cut quartz crystal substrate. For example, by establishing θ=−49° (49° rotation opposite to the arrow direction of θ illustrated in FIG. 5), it is possible to obtain a BT-cut quartz crystal substrate. In addition, an SC-cut quartz crystal substrate can be obtained in such a way that a surface orthogonal to the Y axis of the quartz crystal is rotated approximately 33° about the center of the X axis, and then the surface further rotated by approximately 22° about the center of the Z axis from the rotated position is cut out.

A shape (an outer shape) of the piezoelectric substrate 12 has a rectangular shape in plan view, as illustrated in FIG. 2 (when viewed from the Y' axial direction). A long side of the piezoelectric substrate 12 is formed along the X axis of the quartz crystal, and a short side of the piezoelectric substrate 12 is formed along the Z' axis orthogonal to the X axis of the quartz crystal. The piezoelectric substrate 12 excites using the thickness shear vibration, and can vibrate the thickness shear vibration as a main vibration.

As illustrated in FIG. 3, the piezoelectric substrate 12 has a first main surface 13a, and a second main surface 13b. The first and second main surfaces 13a and 13b are surfaces parallel to the XZ' plane. In an illustrated example, the first main surface 13a is the surface facing the +Y' axial direction, and the second main surface 13b is the surface facing the −Y' axial direction.

The piezoelectric substrate 12 has a two-stage type mesa structure. That is, the piezoelectric substrate 12 has two surfaces which are located in the +Y' axial direction further than the first main surface 13a, and has different heights (a distance from or to the first main surface 13a in the Y' axial direction). In addition, the piezoelectric substrate 12 has two different surface which are located in the −Y' axial direction further than the second main surface 13b, and has different heights (a distance from or to the second main surface 13b in the Y' axial direction). The piezoelectric substrate 12 is the two-stage mesa structure, and thus the resonator element 100 has an effect to confine high energy.

The piezoelectric substrate 12 in two-stage mesa structure includes a first portion 14a having a first stage of the first main surface 13a side and a second portion 16a having a second stage thereof, and a first portion 14b having a first stage of the second main surface 13b side and a second portion 16b having a second stage thereof. As illustrated in FIG. 3, in the piezoelectric substrate 12, the first portion 14a and the second portion 16a, and the first portion 14b and the second portion 16b allow an end of the vibration section 12a in the X-axis direction to become a step shape and thus steps 15a, 15b, 17a, 17b are formed. The length of the first portion 14a in X-axis direction (a direction parallel to the long side of the piezoelectric substrate 12) is longer than length of the second portion 16a in the X-axis direction, the length of the third portion 14b in the X-axis direction is longer than length of the fourth portion 16b in the X-axis direction. That is, the length (the length along the vibration direction of the thickness shear vibration of the vibration section 12a) of the first stage of the vibration section 12a in the X-axis direction is longer than the length of the second stage of the vibration section 12b in the X-axis direction.

As illustrated in FIG. 4, an end of the vibration section 12a in the Z' axial direction does not have the step shape. That is, an end surface of the first portion 14a and the second portion 16b in the Z' axial direction is flush, and an end surface of the third portion 14b and the fourth portion 16b in the Z' axial direction is flush.

As illustrated in FIG. 3, a size Md1 from the main surface 13a of the outer edge 12b to the step 15a of the first stage of the vibration section 12a in the Y'-axis direction is the thickness of (the size of the thickness in the Y' axial direction) the first portion 14a. The size Md1 from the main surface 13b of the outer edge 12b to the step 15b of the first stage of the vibration section 12a in the Y' axial direction is the thickness of the third portion 14b. The size Md2 from the step 15a of the first stage of the vibration section 12a to the step 17a of the second stage of the vibration section 12a in the Y' axial direction is the thickness of the second portion 16a. The size Md2 from the step 15b of the first stage of the vibration section 12a to the step 17b of the second stage of the vibration section 12a in the Y' axial direction is the thickness of the second portion 16b. In the example illustrated, the first portion 14a and the third portion 14b are symmetrically arranged with respect to the XZ' plane passing through the center of the piezoelectric substrate 12. Similarly, the second portion 16a and the fourth portion 16b are symmetrically arranged with respect to the XZ' plane passing through the center of the piezoelectric substrate 12.

As illustrated in FIG. 2, a planar shape of the first portion 14a, the second portion 16a, the third portion 14b and the fourth portion 16b has a rectangular shape in which a side along the X axis is set to be a long side, and a side along the Z' axis is set to be a short side. The vibration section 12a can be configured by the first portion 14a, the second portion 16a, the third portion 14b, and the fourth portion 16b.

In the piezoelectric substrates 12, the vibration section 12a is a portion having a thickness thicker than a thickness t' of the outer edge 12b. Specifically, the vibration section 12a has a portion having a thickness t1 thicker than the thickness t', and a portion having a thickness t2 thicker than the thickness t1. That is, the vibration section 12a is two-stage mesa structure. The vibration section 12a can be excited using a thickness shear vibration and can vibrate in the thickness shear vibration mode as the main vibration. In this case, the thickness shear vibration vibrates along the X axial direction.

As illustrated in FIG. 2, the vibration section 12a is surrounded by the outer edge 12b in plan view. As illustrated in FIG. 2, a outer shape of the vibration section 12a is a rectangular shape in which a side along the X axis, the vibration direction of the thickness shear vibration, is set to be a long side, and a side along the Z' axis orthogonal to the vibration direction of the thickness shear vibration is set to be a short side.

The outer edge 12b is disposed along an outer edge (in the periphery) of the vibration section 12a. The outer edge 12b has a thinner thickness than that of the vibration section 12a. More specifically, the outer edge 12b has a thickness t' thinner than the thickness of the vibration section 12a.

The piezoelectric substrate 12 having the vibration section 12a and the outer edge 12b is formed in such a way that a portion forming the vibration section 12a of a piezoelectric substrate (not illustrated) having a plate shape is covered by a protective film (not illustrated), and a portion forming the outer edge 12b is subjected to chemical etching (etching). In addition, the piezoelectric substrate 12 having the two-stage type mesa structure can be formed in such a way that a portion forming the second portion 16a and the fourth portion 16b is covered by a protective film, and a portion forming the first portion 14a and the third portion 14b is subjected to chemical etching.

The first excitation electrode 20a is disposed on the first main surface 13a of the two-stage mesa. Specifically, the first excitation electrode 20a is disposed on the surface of the second portion 16a. In an example illustrated in FIG. 2, the first excitation electrode 20a has the same planar shape as the second portion 16a, and the first excitation electrode 20a and the second portion 16a are completely overlapped. That is, the outer shape of the first excitation electrode 20a has the same as that of second stage of the vibration section 12a.

The second excitation electrode 20b is disposed on the second main surface 13b of the two-stage mesa. More specifically, the second excitation electrode 20b is disposed on the surface of the fourth portion 16b. In the example illustrated in FIG. 2, the second excitation electrode 20b has the same shape as the fourth portion 16b, and the second excitation electrode 20b and the fourth portion 16b are completely overlapped. That is, the outer shape of the second excitation electrode 20b has the same shape as the second stage of the vibration section 12a.

The excitations electrode 20a and 20b are disposed across the vibration section 12a. The excitation electrodes 20a and 20b can apply a voltage to the vibration section 12a. The excitation electrodes 20a and 20b are connected to the mount electrode 24 via the connection electrode 22. The mount electrode 24 is disposed on the second main surface 13b of the outer edge 12b. For example, the mount electrode 24 is further disposed in the +X axial direction than the vibration section 12a.

The excitation electrodes 20a and 20b, the connection electrode 22 and the mount electrode 24 are configured of metallic materials, for example, by laminating chromium and gold on the piezoelectric substrate 12 side in this order. For example, the excitation electrodes 20a and 20b, the connection electrode 22 and the mount electrode 24 are formed, for example by a sputtering method and a vacuum deposition method.

Herein, when a size from the main surfaces 13a and 13b of the outer edge 12b to the steps 15a and 15b of the first stage of the vibration section 12a in the Y'-axis direction is Md1, a size from the steps 15a and 15b of the first stage of the vibration section 12a to the steps 17a and 17b of the second stage of the vibration section 12a in the Y'-axis direction is Md2, and the piezoelectric material conversion thickness of the excitation electrode 20 is $t_A$, the resonator element 100 satisfies a relationship of (Md2+$t_A$)/Md1≤1.4 (1), and further a relationship of 0.5≤(Md2+$t_A$)/Md1≤1.4 (2).

However, a density of materials (more specifically, the piezoelectric material) of the piezoelectric substrate 12 is $d_A$, a density of materials (more specifically, metallic materials) of the excitation electrodes 20a and 20b is $d_B$ and a thickness (an actual thickness) of the excitation electrodes 20a and 20b is $t_B$, $t_A$ satisfies the relationship of $t_A = (d_B/d_A) \times t_B$ (3).

According to the equation (3), the equation (1) can be expressed by ((Md2+($d_B/d_A$)×$t_B$/Md1))≤1.4 (4).

According to the equation (3), the equation (2) can be expressed by 0.5≤(((Md2+($d_B/d_A$)×$t_B$)/Md1)≤1.4 (5).

By satisfying the equation (4), the resonator element 100 may have the low CI value. Further, by satisfying the equation (5), the resonator element 100 may more reliably have the low CI value. The details will be described later.

2. Experimental Example

An experimental example will be described. The invention is not limited in any circumstance by the following experimental example.

Figure 6A:
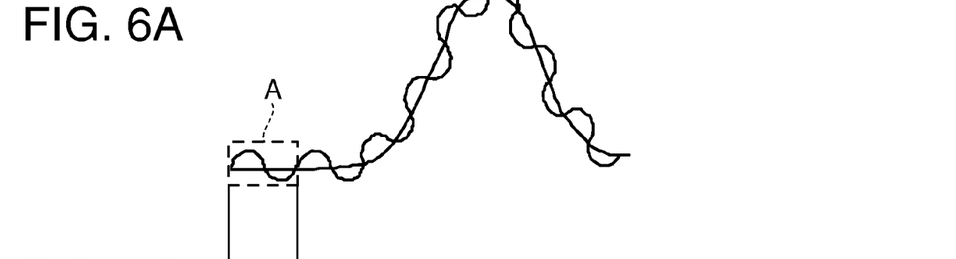
FIGS. 6A and 6B are a cross-sectional view schematically illustrating a resonator element used in an experimental example.
Figure 6B:
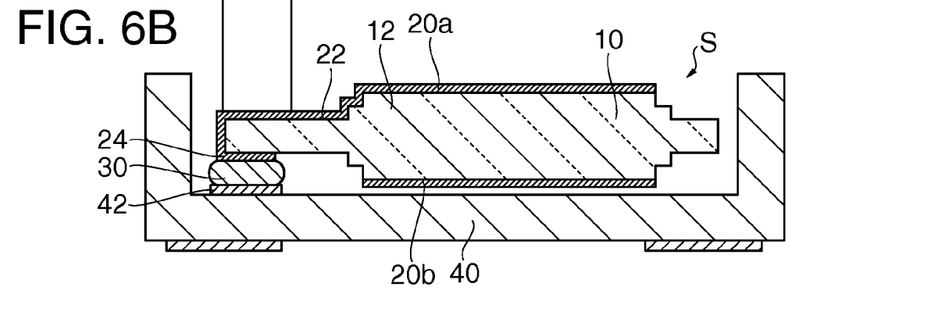
Figure 7:
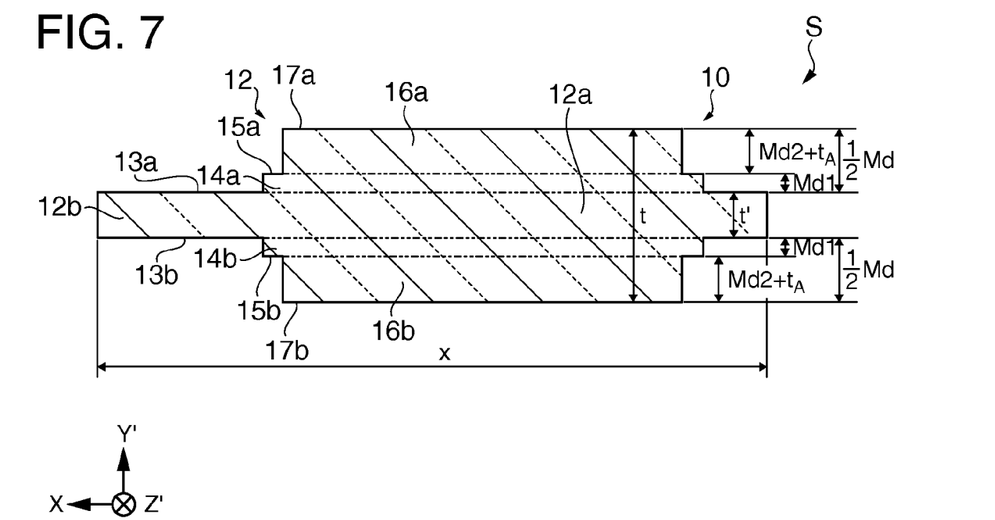
FIG. 7 is a cross-sectional view schematically illustrating a resonator element used in an experimental example.

As the experimental example, a simulation was performed using the resonator element S. FIGS. 6 and 7 are cross-sectional views schematically illustrating a resonator element S. In the resonator element S used in the experimental example, the same reference numerals are given with respect to members having the same function as the resonator element 100. Therefore, the detailed description thereof will be omitted.

In (b) of FIG. 6, the resonator element S is bonded (fixed) to a package base 40 via the connection member 30. More specifically, the resonator element S is fixed to a terminal 42 deposed within the package base 40.

In the resonator element S illustrated in (b) of FIG. 6, a vibration displacement amount in each position in the X-axis direction from an end of the piezoelectric substrate is as illustrated in (a) of FIG. 6, and a vibration displacement in a region A (a mount section: approximately 0.2 (mm) from the end of the piezoelectric substrate 12) surrounded by a broken line becomes a CI component to be lost due to the influence of the mount.

The resonator element S illustrated in FIG. 7 has basically the same configuration as the resonator element 100 except that the thickness of the second portion 16a and the fourth portion 16b of the piezoelectric substrate 12 (the size from the steps 15a and 15b to the second steps 17a and 17b of the vibration section 12a in the Y' axis direction) is set to be (Md2+$t_A$). In the experimental example, as the piezoelectric substrate 12, the AT-cut quartz crystal substrate was used. In addition, the resonator element S illustrated in FIG. 7 does not have the connection electrode 22 and the mount electrode 24.

Herein, when $t_A$ is the piezoelectric material conversion thickness of the excitation electrodes 20a and 20b, and the density of the piezoelectric materials (quartz crystal) configuring the piezoelectric substrate 12 is $d_A$, the density of metallic materials configuring the excitation electrodes 20a and 20b is $d_B$, and the actual thickness of the excitation electrodes 20a and 20b is $t_B$, $t_A$ can be expressed as follows.

$$t_A = (d_B/d_A) \times t_B \quad (3)$$

Figure 8:
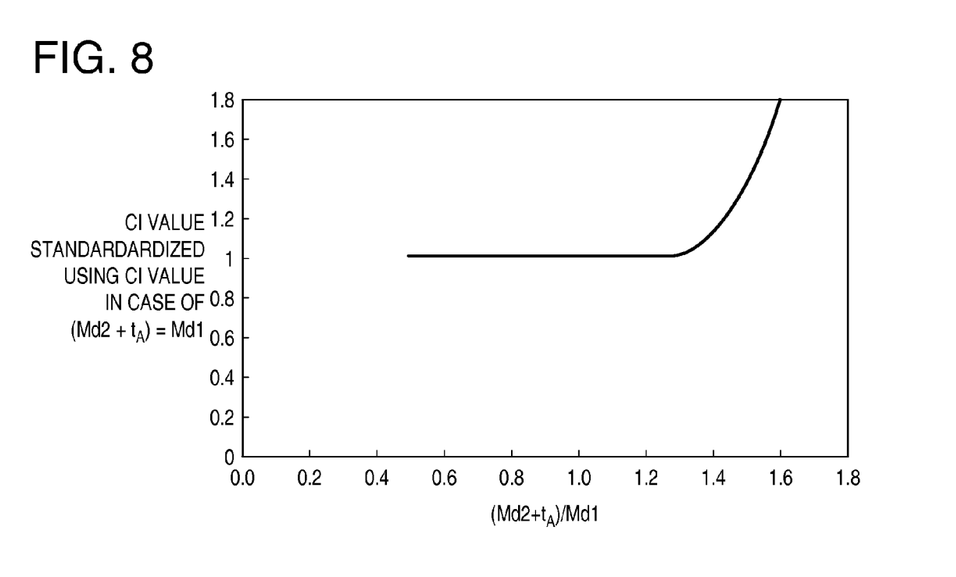
FIG. 8 is a graph illustrating a relationship between a size of a step of a mesa structure and a CI value.

In the resonator element S illustrated in FIG. 7 as described above, by changing the value of (Md2+$t_A$) to Md1, a simulation analyzing the CI value was performed. FIG. 8 is a graph illustrating the relationship between a ratio r (=(Md2+$t_A$)/Md1) of (Md2+$t_A$) to Md1 and the CI value. More specifically, the analysis was performed within a range where the ratio r is equal to 0.5 or greater. In addition, in FIG. 8, the CI value represents a value standardized using the CI value in a case of (Md2+$t_A$)=Md1.

Generally, the C/I value includes components such as a leakage of the vibration to the outer atmosphere (an influence of an ambient atmosphere to which the piezoelectric substrate is exposed), and an energy loss (an influence of the materials) within the piezoelectric substrate. However, when the influence of these components is constant, the CI value may be represented by the influence of a degree of the mount. FIG. 8 is a graph illustrating the relationship between the ratio r (=(Md2+$t_A$)/Md1) of (Md2+$t_A$)) to Md1 and the CI value obtained from the detailed description.

According to FIG. 8, it was found that when the ratio r is greater than 1.4, the C/I value rapidly increases. Therefore, by satisfying the relationship of (Md2+$t_A$)/Md1/≤1.4 (1), it was found that the resonator element S is capable of decreasing the CI value. That is, by satisfying the relationship of (Md2+($d_B/d_A$)×$t_B$)/Md1)≤1.4, (4) from the equations (1) and (3), it was found that the vibration device S is capable of decreasing the CI value.

More specifically, by satisfying the relationship of 0.5≤(Md2+$t_A$)/Md1≤1.4 (2), it was found that the vibration device S is capable of more reliably decreasing the CI value. That is, by satisfying the relationship of 0.5≤((Md2+($d_B$/$d_A$)×$t_B$)/Md1≤1.4 (5) from the equations (2) and (3), it was found that the resonator element S is capable of more reliably decreasing the CI value.

The number of the stages of the mesa is increased to become two stages with respect to the one-stage, whereby enabling the strong energy confinement of the thickness shear vibration of the main vibration confined to the vibration section 12a. In this manner, it was found that (Md2+$t_A$)/Md1 is preferably 0.5 or greater. When (Md2+$t_A$)/Md1 is greater than 0.5 and less than 0.5, the energy confinement may become stronger than that of the one-stage mesa. However, thickness of second-stage becomes thin. Therefore, it is found that the strong energy confinement of the two-stage mesa may not be sufficiently achieved.

Herein, when (Md2+$t_A$)/Md1=1.4 is established, if a specific value of each parameter is exemplified, the result shows the size Md1=5 (μm) of the first step of the mesa structure, the size Md2=3.35 (μm) of the step of the second stage of the mesa structure, the actual thickness $t_B$=0.5 (μm) of the excitation electrodes 20a and 20b, the density $d_A$=2.65

($g/cm^3$) of the piezoelectric materials (quartz crystal) configuring the piezoelectric substrate 12, and the density $d_B$=19.32 ($g/cm^3$) of the metallic materials (chrome and gold layers) configuring the excitation electrodes 20a and 20b.

In the experimental example (simulation), when the etching amount (a difference between the thickness t of the vibration section 12a and the thickness t' of the outer edge 12b) from the piezoelectric substrate 12 to obtain the mesa structure is Md, the length of the long side of the piezoelectric substrate 12 is x, and the thickness of the vibration section 12a is t, the percentage z of the ratio of the etching amount Md to the thickness t of the vibration section 12a, the resonator element S satisfying this relationship of Z=−1.32×(x/t)+42.87(%) (6) is used. Herein, the thickness t of the vibration section 12a represents a maximum thickness of the vibration section 12a.

By satisfying the equation (6), it is possible to select the value of the minimum etching amount Md which allows the characteristic change of the CI value to be flat. That is, the larger the etching amount Md becomes, the more the CI value tends to decrease. However, if the etching time for forming the etching amount Md becomes long, the protective film formed on the portion other than the etching portion is deteriorated and, the etching corrosion occurs. The etching corrosion shows different tendencies depending on states of the protective film and the piezoelectric substrate and thus variations of the piezoelectric substrate shape increases due to the etching corrosion. In addition, as an etching time increases, a manufacturing cost becomes high. Further, the binding of an unnecessary mode with respect to the main vibration mode shows an opposite tendency to the decrease in the CI value caused by the increase in the etching amount Md. Therefore, when the etching amount Md is allowed to increase, a bending mode that is an unnecessary mode is easily added to the thickness shear mode that is a primary mode and thus there is a possibility of the deteriorated vibration characteristics. Therefore, if the minimum value which allows the characteristic change of the CI value to be flat can be selected as the etching amount Md, a possibility of the etching corrosion and the deteriorated vibration characteristics may be reduced and thus it is possible to obtain improved vibration characteristics.

Herein, even if a percentage z of the ratio to the thickness t of the vibration section 12a of the etching amount Md is decreased by 5% less than the value calculated from the equation (6), it is possible to sufficiently decrease the CI value. Therefore, z may satisfy the relationship of the following equation (7).

$$-5 \leq z+1.32 \times (x/t) - 42.87 (\%) \quad (7)$$

In addition, even if a percentage z of the ratio to the thickness t of the vibration section 12a of the Md is 5% more than the value calculated from the equation (6), it is possible to sufficiently suppress the occurrence of the etching corrosion and the binding of the unnecessary mode with respect to the main vibration mode. Therefore, z may satisfy the relationship of the following equation (8).

$$-5 \leq z+1.32 \times (x/t) - 42.87 \leq 5 (\%) \quad (8)$$

In addition, the equation (6) is a equation obtained in such a way that the etching amount Md is allowed to vary for each edge ratio x/t (the ratio representing the length x of the long side of the piezoelectric substrate 12a with respect to the thickness t of the vibration section 12a) and performs experiments to analyze the change of the CI value, and a minimum value Md_min of the etching amount Md which allows the characteristic change of the CI value to be flat is obtained.

Furthermore, preferably, the edge ratio of x/t is 30 or less. When the edge ratio of x/t exceeds 30, a value of the Md_min sufficiently decreases, and thus it is unnecessary to form the piezoelectric substrate as the mesa type. That is, even if the piezoelectric substrate is not formed as the mesa type, it is possible to sufficiently obtain a low CI value. Therefore, the piezoelectric substrate in which the edge ratio of x/t is 30 or less is formed in a mesa type, and thus the piezoelectric substrate is capable of decreasing the CI value while being miniaturized. In the embodiment, the value of the edge ratio x/t is set to be 13.

In addition, in the experimental example, the AT-cut quartz crystal substrate is used as the piezoelectric substrate 12. However, the experimental example can be applied even when a piezoelectric substrate other than the AT-cut quartz crystal substrate is used. However, it is desirable that the quartz crystal substrate be used as the piezoelectric substrate 12 in view of convenient substrate processing, that is, mesa processing.

In addition, in the experimental example, the end of the vibration section 12a in the Z'-axis direction uses the resonator element S in which the step shape is not formed. However, the experimental example can be applied to the resonator element having the step shape (see the resonator element 200 described later).

3. Modification Example of Resonator Element

Figure 9:
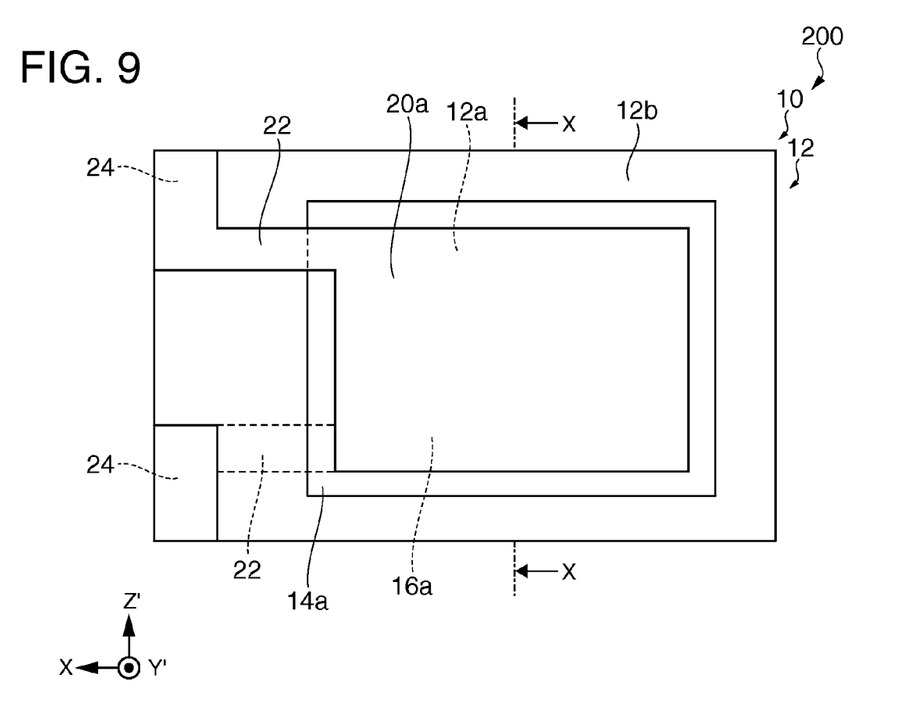
FIG. 9 is a plan view schematically illustrating a resonator element according to a modification example of the embodiment.
Figure 10:
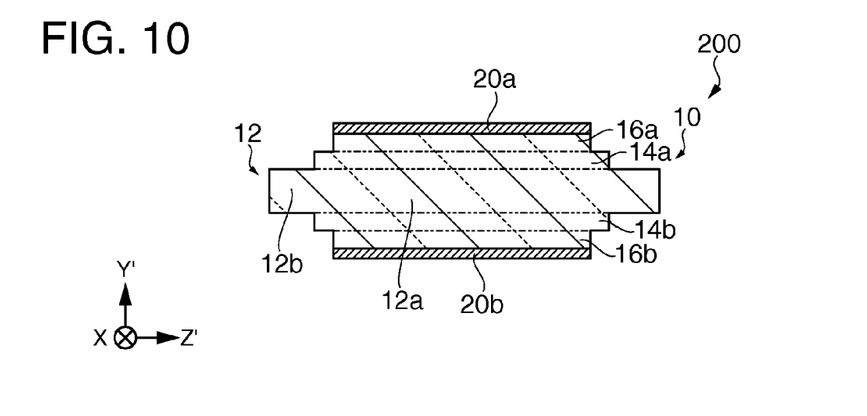
FIG. 10 is a cross-sectional view schematically illustrating a resonator element according to a modification example of the embodiment.

A resonator element according to a modification example of the embodiment will be described with reference to the drawings. FIG. 9 is a plan view schematically illustrating a resonator element 200 according to a modification example of the embodiment. FIG. 10 is a cross-sectional view taken along the line X-X of FIG. 9 schematically illustrating the resonator element 200 according to the modification example of the embodiment. As described below, in the resonator element 200, the same reference numerals are given with respect to members having the same function as the element of the resonator element 100. Therefore, the detailed description thereof will be omitted.

In the resonator element 100, as illustrated in FIGS. 2 and 4, an end of the vibration section 12a in the Z' axial direction does not have a stepped shape. That is, the end surface of the first portion 14a and the second portion 16a in the Z' axial direction is flush, and the end surface of the third portion 14b and the fourth portion 16b in the Z' axial direction is flush.

On the other hand, as illustrated in FIGS. 9 and 10, in the resonator element 200, the end of the vibration section 12a in the Z' axial direction has a stepped shape, and thus the step is formed. That is, the length of the first portion 14a in the Z' axial direction is longer than that of the second portion 16a in the Z' axial direction, and the length of the third portion 14b of the Z' axial direction is longer than that of the fourth portion 16b in Z' axial direction.

That is, by satisfying the equation (4), the resonator element 200 is capable of decreasing the CI value similarly to the resonator element 100.

4. Resonator

Figure 11:
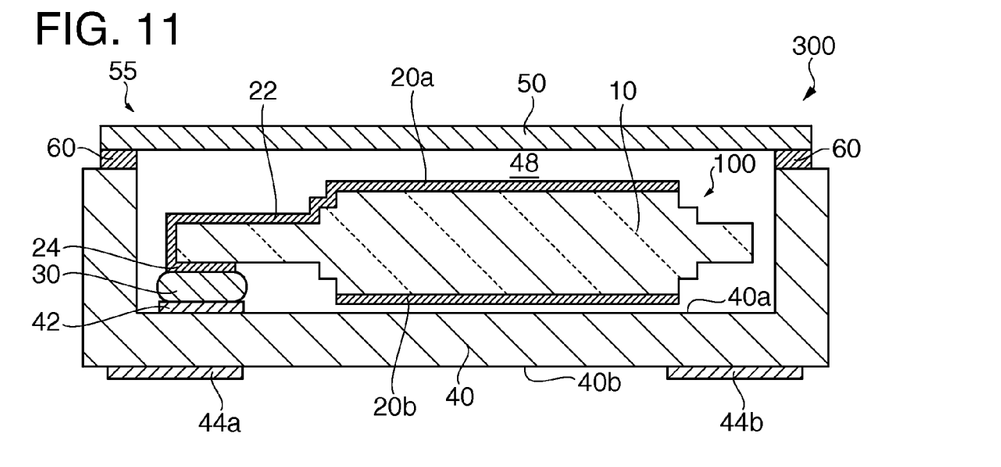
FIG. 11 is a cross-sectional view schematically illustrating a resonator according to the embodiment.

A resonator according to the embodiment will be described with reference to the drawings. FIG. 11 is a cross-sectional view schematically illustrating a resonator 300 according to the embodiment.

As illustrated in FIG. 11, the resonator 300 includes the resonator element according to the embodiment of the invention, and a package 55. Hereinafter, as the vibration device according to the embodiment of the invention, an example in which the vibration device 100 is used will be described.

The package 55 accommodates the vibration device 100. The package 55 includes a package base 40, and a lid 50.

A concave portion 48 is formed within the package base 40 and the resonator element 100 is disposed within the concave portion 48. The planar shape of the package base 40 is not particularly limited thereto if the resonator element 100 can be disposed within the concave portion 48. The package base 40 uses a material such as aluminum oxide sintered body in which a molded ceramic green sheet is fired and stacked, crystal, glass, silicon and the like.

The resonator element 100 is bonded (mounted) to the first surface (the bottom surface within the concave portion 48 in the example of the drawings) 40a of the package base 40, via the conductive bonding agent 30. More specifically, the conductive bonding agent 30 bonds the first terminal 42 disposed in the first surface 40a, and the mount electrode 24 of the vibration device 100 to each other.

Second terminals 44a and 44b used when mounted to an external member such as an electronic apparatus are disposed on the second surface (the surface opposite to the first surface 40a) 40b of the package base 40. The second terminal 44a may be connected to the first terminal 42 via a contact portion (not illustrated) passing through the package base 40. Therefore, the second terminal 44a and the first excitation electrode 20a are electrically connected to each other.

In addition, a terminal (not illustrated) is disposed on the first surface 40a, and the terminal and the second excitation electrode 20b may be electrically connected to each other. Then, the terminal and the second terminal 44b may be connected to each other via a contact portion (not illustrated) passing through the package base 40. Therefore, the second terminal 44b and the second excitation electrode 20b may be electrically connected to each other.

For example, for the first terminal 42 and the second terminals 44a and 44b, a metallic film in which a film such as nickel and gold is staked on matrix layer such as tungsten by a method such as plating is used.

The lid 50 is provided to cover the concave portion 48 of the package base 40. In the illustrated example, the shape of the lid 50 is a plate shape. For example, lid 50 uses the same material as the package base 40, or metal such as Kovar, 42 alloy and stainless steel. For example, the lid 50 is bonded to the package base 40 via a bonding member 60 such as a seam ring, a low-melting glass and a bonding agent.

The inner side of the hermetically sealed concave portion 48 of the package base 40 becomes a reduced vacuum state (state in which a degree of vacuum is high), or a state in which an inert gas such as nitrogen, helium and argon is filled.

5. Modification Example of Resonator

The resonator 300 has the resonator element 100 capable of decreasing the IC value.

Figure 12:
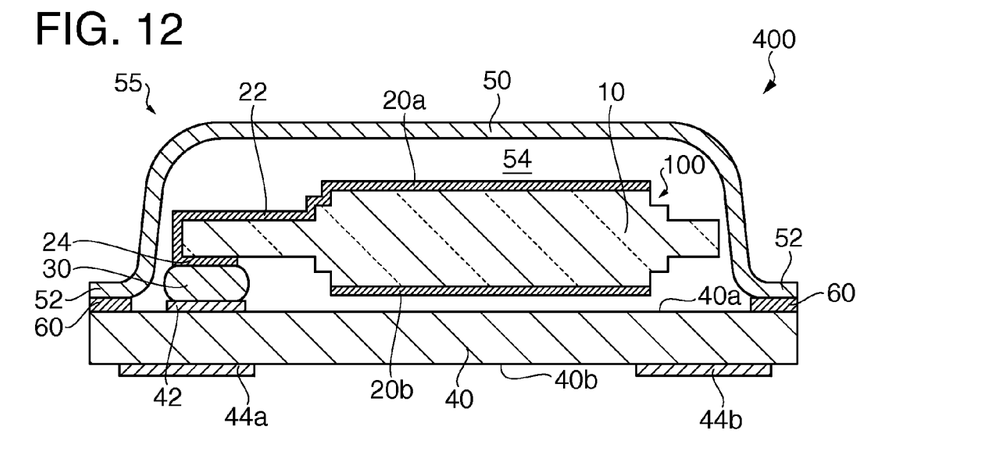
FIG. 12 is a cross-sectional view schematically illustrating a resonator according to a modification example of the embodiment.

A resonator according to the modification example of the embodiment will be described with reference to the drawings. FIG. 12 is a cross-sectional view schematically illustrating a resonator 400 according to a modification example of the embodiment. As described below, in the resonator 400, the same reference numerals are given with respect to the members having the same function as the element of the resonator 300. Therefore, the detailed description thereof will be omitted.

As illustrated in FIG. 11, in the resonator 300, the concave portion 48 is disposed within the package base 40. On the other hand, as illustrated in FIG. 12, in the resonator 400, the concave portion 48 is not disposed within the package base 40, and the package base 40 has a plate shape.

In the resonator 400, the lid 50 has a cap shape (a container shape) in which a flange section 52 is disposed on the entire periphery thereof and can accommodate the resonator element 100 in the space 54 inside thereof. The flange portion 52 is bonded to the package base 40 via a joining member 60. The lid 50 uses metal such as Kovar, 42 alloy and stainless steel.

According to the resonator 400, the package base 40 compared with the resonator 300 may not be provided with the concave portion 48, and thereby enabling easier manufacturing, and a decreased manufacturing cost for the package base 40 that much.

6. Electronic Device

Figure 13:
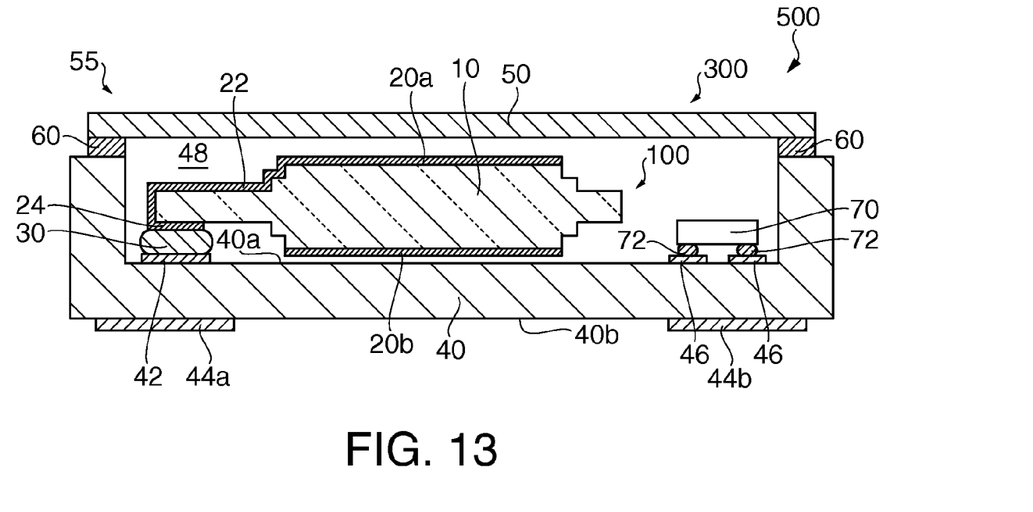
FIG. 13 is a cross-sectional view schematically illustrating an electronic device according to the embodiment.

An electronic device according to the embodiment will be described with reference to the drawings. FIG. 13 is a cross-sectional view schematically illustrating an electronic device 500 according to the embodiment.

As illustrated in FIG. 13, the electronic device 500 includes the resonator element according to the embodiment of the invention, and an electronic element 70. More specifically, the electronic device 500 includes the resonator according to the embodiment of the invention. Hereinafter, an example using the resonator 300 including the resonator element 100 will be described as the resonator according to the embodiment of the invention.

The electronic element 70 is accommodated in a package 55. More specifically, the electronic element 70 is disposed in the concave portion 48 disposed on the package base 40. For example, the electronic element 70 uses an IC chip provided with an oscillation circuit that drives the resonator element 100. Furthermore, the IC chip may be provided with a temperature compensation circuit that compensates for frequency variations due to a temperature change of the resonator element 100. When the IC chip including the oscillation circuit is used as the electronic element 70, the electronic device 500 can function as an oscillator. In addition, the electronic element 70 is not limited to the above-described IC chip, and, for example may be a thermistor, a capacitor and a reactance element.

The electronic element 70 is electrically connected to a third terminal 46 disposed on the first surface 40a of the package base 40 via a bump 72. For example, the third terminal 46 is electrically connected to the first terminal 42 by a wire (not illustrated). Therefore, the electronic element 70 and the first excitation electrode 20a are electrically connected to each other. In addition, the electronic element 70 is electrically connected to the second excitation electrode 20b by a wire (not illustrated).

For example, the bump 72 uses a metal bump such as gold and nickel. For example, the third terminal 46 uses a metal film in which a film such as nickel, gold and the like is stacked on a matrix layer such as tungsten using a method such as plating.

In addition, although not illustrated, the electronic element 70 may be electrically connected to the third terminal 46 by a wire in place of the bump 72.

The electronic device 500 can be provided with the resonator element 100 capable of decreasing the CI value.

7. Modification Example of Electronic Device

Figure 14:
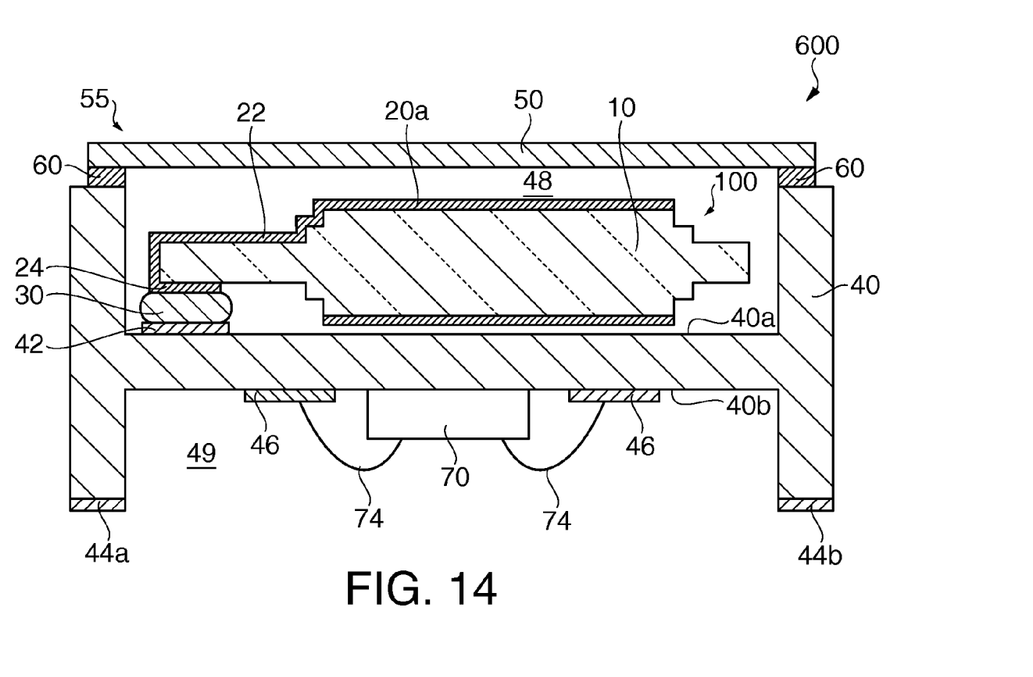
FIG. 14 is a cross-sectional view schematically illustrating an electronic device according to a modification example of the embodiment.

An electronic device according to a modification example of the embodiment will be described with reference to the drawings. FIG. 14 is a cross-sectional view schematically illustrating an electronic device 600 according to a modification example of the embodiment. As described below, in the electronic device 600, the same reference numerals are given with respect to members having the same function as the electronic device 500.

As illustrated in FIG. 13, in the electronic device 500, the electronic element 70 is disposed on the first surface 40a side of the package base 40, and is disposed within the concave portion 48 disposed in the package base 40. On the other hand, as illustrated in FIG. 14, in the electronic device 600, the second surface 40b of the package base 40 is disposed within a concave portion 49 in which the second surface 40b of the package base 40 forms the bottom surface. In the electronic device 600, the package base 40 may have substantially an H-shape.

The electronic element 70 may be bonded to the second surface 40b by a bonding agent (not illustrated). The electronic element 70 is electrically connected to the third terminal 46 disposed on the second surface 40b via a wire 74. For example, the material of the wire 74 is gold.

In addition, although not illustrated, the electronic element 70 may be electrically connected to the third terminal 46 by a bump in place of the wire 74.

According to the electronic device 600, the resonator element 100 and the electronic element 70 may be separated from each other. Accordingly, the resonator element 100 may be hermetically sealed individually, and thus the electronic device has enhanced frequency aging characteristics.

8. Electronic Apparatus

Figure 15:
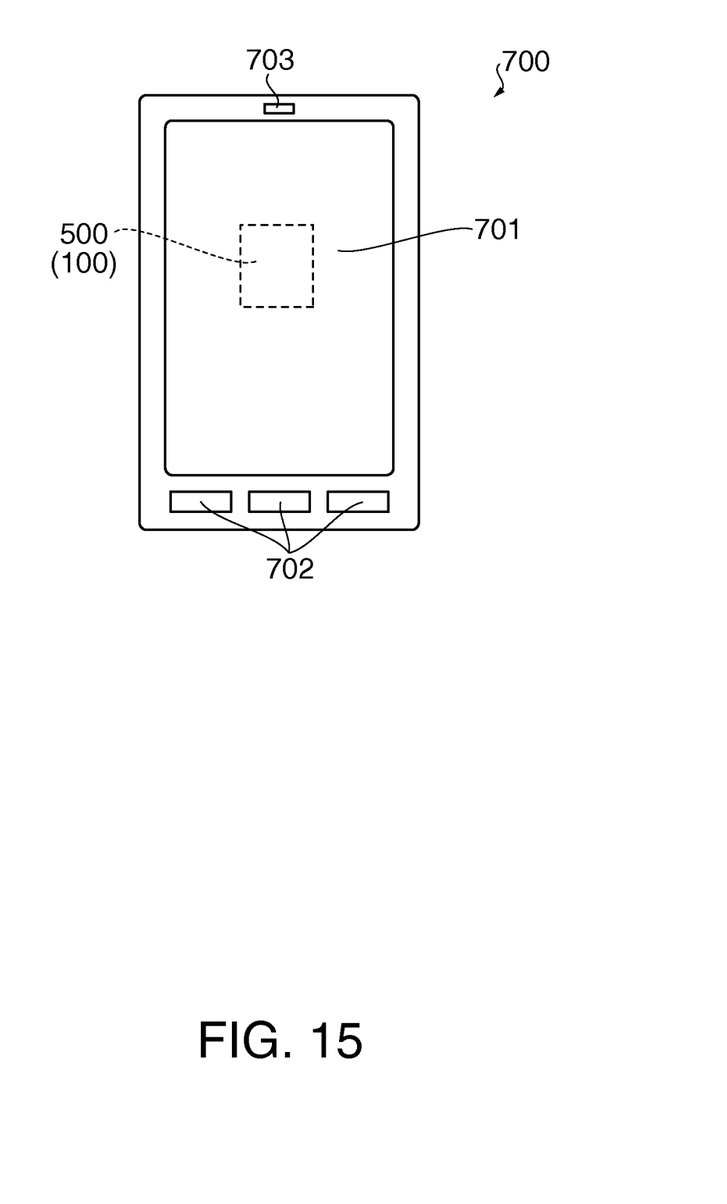
FIG. 15 is a plan view schematically illustrating an electronic apparatus according to the embodiment.

An electronic apparatus according to the embodiment will be described with reference to the drawings. FIG. 15 is a plan view schematically illustrating a mobile phone (a smart phone) as the electronic apparatus according to the embodiment of the invention.

The smart phone 700 includes the resonator element according to the embodiment of the invention. More specifically, the smart phone 700 includes the electronic device according to the embodiment of the invention. Hereinafter, as illustrated in FIG. 15, as the electronic device according to the embodiment of the invention, an example using the electronic device 500 provided with the resonator element 100 will be described. In addition, in FIG. 15, for convenience, the electronic device 500 is simply illustrated.

The smart phone 700 uses the electronic device 500, for example, as a timing device such as a reference clock oscillation source. In addition, the smart phone 700 may include a display section 701 (such as a liquid crystal display and an organic EL display), an operation section 702, and a sound output section 703 (such as a microphone). The smart phone 700 uses the display section 701 as the operation section by providing a contact detection mechanism with respect to the display section 701.

The smart phone 700 may have the resonator element 100 capable of decreasing the CI value.

In addition, as described above, it is preferable that the electronic apparatus represented by the smart phone (the mobile phone) 700 include an oscillation circuit that drives the resonator element 100, and a temperature compensation circuit that compensates for frequency variations due to a temperature change of the resonator element 100.

According to this configuration, the electronic apparatus represented by the smart phone 700 includes the temperature compensation circuit that compensates for the frequency variations due to the temperature change of the resonator element 100, together with the oscillation circuit that drives the resonator element 100. Therefore, a resonance frequency in which the oscillation circuit oscillates is temperature-compensated, and thus it is possible to provide the electronic apparatus having excellent temperature characteristics.

The electronic apparatus including the resonator element according to the embodiment of the invention is not limited to the smart phone, and may be preferably used as a timing device such as an electronic book, a personal computer, a television, a digital still camera, a video camera, a video recorder, a navigation device, a pager, an electronic organizer, a calculator, a word processor, a workstation, a videophone, a POS terminal and an apparatus having a touch panel.

The above-described embodiments and modification examples are merely examples, and therefore, the invention is not limited thereto. For example, it is also possible to appropriately combine each of the embodiments and each of the modification examples.

The invention includes substantially the same configuration as that described in the exemplary embodiment (for example, a configuration having the same function, method and result or a configuration having the same object and advantage). In addition, the invention includes a configuration obtained by replacing a non-essential part of the configuration described in the embodiment. Further, the invention includes a configuration which has the same effect as the configuration described in the embodiment, or a configuration capable of achieving the same object. Furthermore, the invention includes a configuration in which a known technology is added to the configurations described in the embodiments.

The entire disclosure of Japanese Patent Application No. 2012-063267, filed Mar. 21, 2012 is expressly incorporated by reference herein.

What is claimed is:

1. A resonator element comprising:
   a substrate including a vibration section that vibrates in a thickness shear vibration mode, the vibration section having a first step and a second step adjacent to the first step, and the substrate having an outer edge that is disposed along an edge of the vibration section and has a thickness t' less than a thickness t of the vibration section; and
   an excitation electrode that is disposed on the vibration section,
   wherein when a distance from a main surface of the outer edge to a surface of the first step of the vibration section is Md1, a distance from the surface of the first step to a surface of the second step is Md2, a density of materials of the substrate is $d_A$, a density of materials of the excitation electrode is $d_B$, and a thickness of the excitation electrode on a major surface of a mesa defined by the second step is $t_B$, a relationship of $((Md2+(d_B/d_A) \times t_B))/Md1 \leq 1.4$ is satisfied; and
   wherein when a difference between the thickness t of the vibration section and the thickness t' of the outer edge is Md, a length of the substrate in the vibrating direction of the thickness shear vibration mode is x, a percentage z of a ratio of the difference Md to the thickness t of the vibration section satisfies the relationship of:

$$-5 \leq z + 1.32(x/t) - 42.87 \leq 5 (\%).$$

2. The resonator element according to claim 1, wherein a relationship of $0.5 \leq ((Md2+(d_B/d_A) \times t_B))/Md1 \leq 1.4$ is satisfied.

3. The resonator element according to claim 1, wherein the substrate is a Y-cut quartz crystal substrate that is cut out from a material along a plane on which an XZ plane is rotated around the X axis by an angle θ.

4. The resonator element according to claim 1, wherein an outer shape of the vibration section is a rectangular shape in plan view, and
a length along a vibration direction of the thickness shear vibration of the first step of the vibration section is longer than a length along a vibrating direction of the thickness shear vibration of the second step of the vibration section.

5. The resonator element according to claim 1, wherein an outer shape of the excitation electrode is the same as an outer shape of the second step of the vibration section in plan view.

6. A resonator comprising:
a resonator element according to claim 1; and
a package accommodating the resonator element.

7. A resonator comprising:
a resonator element according to claim 2; and
a package accommodating the resonator element.

8. An electronic device comprising:
the resonator element according to claim 1; and
an electronic element.

9. An electronic device comprising:
the resonator element according to claim 2; and
an electronic element.

10. An electronic apparatus comprising:
a resonator element according to claim 1.

11. An electronic apparatus comprising:
a resonator element according to claim 2.

12. The resonator element according to claim 1, wherein Md2 is greater than Md1.

13. The resonator element according to claim 1, wherein Md2 is less than Md1.

14. The resonator element according to claim 1, wherein the first step and the second step are directly adjacent to each other.

* * * * *